United States Patent
Ohkawa

(10) Patent No.: US 6,733,678 B2
(45) Date of Patent: May 11, 2004

(54) LIQUID SUBSTRATE COLLECTOR

(75) Inventor: Tihiro Ohkawa, La Jolla, CA (US)

(73) Assignee: Archimedes Technology Group, Inc., San Diego, CA (US)

( * ) Notice: Subject to any disclaimer, the term of this patent is extended or adjusted under 35 U.S.C. 154(b) by 255 days.

(21) Appl. No.: 10/086,950

(22) Filed: Feb. 28, 2002

(65) Prior Publication Data

US 2003/0159998 A1 Aug. 28, 2003

(51) Int. Cl.[7] .............................. C23C 16/513
(52) U.S. Cl. ..................... 210/681; 210/683
(58) Field of Search ................. 210/681, 683, 210/688, 695, 748, 222; 118/723 R

(56) References Cited

U.S. PATENT DOCUMENTS

| | | | |
|---|---|---|---|
| 5,126,030 A | * | 6/1992 | Tamagaki et al. ...... 204/192.38 |
| 5,218,179 A | | 6/1993 | Matossian |
| 5,304,279 A | | 4/1994 | Coultas |
| 5,350,454 A | | 9/1994 | Ohkawa |
| 5,361,016 A | | 11/1994 | Ohkawa |
| 6,096,220 A | | 8/2000 | Ohkawa |

* cited by examiner

Primary Examiner—Robert A. Hopkins
(74) Attorney, Agent, or Firm—Nydegger & Associates

(57) ABSTRACT

An apparatus for removing selected metal ions from a plasma includes a plasma chamber and at least one silica substrate mounted inside the chamber. More specifically, the substrate is exposed in the chamber so that when metal ions from the plasma contact the substrate they diffuse into the substrate to create a liquified layer. A receptacle is also provided to receive the liquid from the layer as it flows from the substrate.

20 Claims, 1 Drawing Sheet

LIQUID SUBSTRATE COLLECTOR

FIELD OF THE INVENTION

The present invention pertains generally to devices, apparatus and methods for separating selected metal ions from a plasma. In particular, the present invention pertains to collectors for removing ions of a selected material from a plasma separator. More particularly, the present invention pertains to metal ion collectors for plasma separators that include silica (glass) substrates which liquify when diffused by metal ions to create a collectable liquid.

BACKGROUND OF THE INVENTION

In the operation of a plasma mass filter, as well as in the operation of other types of plasma separators, it is always necessary to somehow establish a mechanism for effectively collecting the target material that is being processed. To this end, the collection process needs to be as efficacious and as easy to implement as possible. Various techniques for collecting material from a plasma mass separator have been heretofore suggested. These suggestions include the more obvious task of physically removing and replacing collectors of the target material. Additionally, these suggestions include more subtle processes, such as introducing a medium into the plasma chamber for in situ cleaning of collectors, as disclosed in U.S. Pat. No. 6,139,681, which issued to Ohkawa for an invention entitled "Plasma Assisted Process Vessel Cleaner" and which is assigned to the same assignee as the present invention. Still, the very nature of plasmas lend themselves to other possible collection methods.

It is known that when oxygen and metal vapors of a plasma come into contact with the surface of a solid glass substrate close to its melting point, the nature of the substrate surface is changed. An important change results from the fact that as oxides of the metal diffuse into the substrate, a surface layer of the substrate softens and turns from a solid state into a liquid state. The viscosity of this resulting liquified surface layer will depend on both the species of the metal oxides that are involved in the process and their concentration in the surface layer.

Once a surface layer of the glass substrate begins to liquify, the tendency is for the surface layer to drip from the substrate. In this condition, it is possible that the diffusion rate at which metal atoms diffuse into the substrate will exceed the rate at which metal atoms are deposited onto the substrate surface. If so, there will be no solid deposit on the surface layer. On the other hand, it is also possible that the deposition rate will be higher than the diffusion rate. In this latter case, a solid deposit will form on the liquified surface layer. In either event, at some point in time, the liquified surface layer of the substrate will begin to drip from the substrate. When this happens, the drip will include the metal atoms that have diffused into the surface layer of the substrate, as well as any solid deposit that may have formed on the surface layer.

A mathematical expression for the motion of a liquified surface layer relative to an underlying substrate can be obtained by balancing the viscous forces in the surface layer and the gravitational forces that are acting on the layer. For this expression, we assume the substrate is vertically oriented and we obtain $$dy/dt \approx [\rho g/\eta]d[d+w] \qquad \text{(eqn. 1)}$$

where "y" is the vertical position of the substrate, "$\rho$" is the mass density of the surface layer, "g" is the gravitational acceleration, "$\eta$" is the viscosity of material in the surface layer, "d" is the thickness of the surface area, and "w" is the thickness of the solid deposit.

As indicated above, any movement of the liquified surface layer should account for the possibilities that for a given throughput per unit area, $\Gamma$, a solid deposit layer may, or may not, form on the surface layer. Accordingly, the throughput, $\Gamma$, will include a diffusion term (surface layer) and a deposition term (deposition layer), and can be expressed as $$\Gamma = nD/d + ndw/dt \qquad \text{(eqn. 2)}$$

where "n" is the solid density, and "D" is the diffusion coefficient of metal atoms in the substrate glass.

As diffusion occurs, the diffusion depth of the surface layer at any given time "t" can be expressed as $$d \sim [Dt]^{1/2}. \qquad \text{(eqn. 3)}$$

Returning for the moment to the expression for throughput, $\Gamma$ (eqn. 2), it will be appreciated that the diffusion term (nD/d) dominates early in time until the thickness of the surface layer reaches $d_1$, given by the expression $$d_1 \sim nD/\Gamma. \qquad \text{(eqn. 4)}$$

With the above in mind, it is possible to define a low throughput regime wherein no solid deposit is formed on the liquified surface layer, and a high throughput regime wherein there is a solid deposit. For this purpose we can define the low throughput regime by the transit time it takes for the surface layer to move across the collector substrate through a vertical height "h." Specifically, this low throughput regime persists when the transit time "$t_t$" for the thickness of the surface layer "d" to reach "$d_1$" (eqn. 4) is shorter than the diffusion time "$t_1$". In this regime, the expression given above for movement of the surface layer (eqn. 1) becomes $$dy/dt \approx [\rho g/\eta]d^2 \qquad \text{(eqn. 5)}$$

and the transit time $t_2$ is given by $$t_2 \approx [2h\eta/\rho g D]^{1/2}. \qquad \text{(eqn. 6)}$$

Under conditions wherein $t_2 < t_1$, the throughput, $\Gamma$, becomes $$\Gamma < n[\rho g D^3/2h\eta]^{1/4}. \qquad \text{(eqn. 7)}$$

If the throughput, $\Gamma$, is larger than the critical value defined in the above expression, the movement of the surface layer can be approximated by $$dy/dt \approx [\rho g/\eta]d_1 w. \qquad \text{(eqn. 8)}$$

The thickness of the deposition layer "w" during the transit time can then be given by the expression $$w \approx [\Gamma/n][2h\eta/D\rho g]^{1/2}. \qquad \text{(eqn. 9)}$$

In light of the above it is an object of the present invention to provide an apparatus and method for removing selected metal ions from a plasma which includes a collector that can be used in the vacuum chamber of a plasma separator to continuously remove collected material from the chamber. It is another object of the present invention to provide an apparatus and method for removing selected metal ions from a plasma which incorporates a collector that allows for a periodic replenishment of the collector in the vacuum chamber of a plasma mass separator. Still another object of the present invention is to provide an apparatus and method for removing selected metal ions from a plasma which allows material having a relatively high throughput, and other material having a relatively low throughput, to be simultaneously collected on respective collectors.

Yet another object of the present invention is to provide an apparatus and method for removing selected metal ions from a plasma which is relatively easy to implement, is simple to use, and is comparatively cost effective.

SUMMARY OF THE PREFERRED EMBODIMENTS

An apparatus for removing selected metal ions from a plasma uses a plasma filter which has a chamber (container) for processing a multi-species plasma. More specifically, the plasma filter separates the multi-species plasma into relatively light ions which have a charge to mass ratio $M_1$, and relatively heavy ions which have a charge to mass ratio $M_2$. The plasma filter does this by directing the ions $M_1$ and the ions $M_2$ onto separate trajectories inside the plasma chamber. Within this context, the present invention is directed to the collectors that are mounted in the chamber for the purposes of separately collecting the ions $M_1$ and the ions $M_2$, and removing them from the chamber.

In accordance with the present invention, both the $M_1$ ion collector and the $M_2$ ion collector include a substrate that is mounted and exposed in the plasma chamber for contact with the selected metal ions ($M_1$ or $M_2$). Preferably, each substrate is made of a crystalline compound, such as silica ($SiO_2$), which is interactive with the metal ions ($M_1$ and $M_2$) of the multi-species plasma. Specifically, the interaction of interest for the present invention involves the diffusion of these metal ions into the respective substrates. In each case this diffusion creates a liquified layer of the substrate that will eventually flow or drip from the substrate. Also, in cases where the deposition rate of the metal ions onto the substrate exceeds the diffusion rate of the metal ions into the substrate material (silica), a solid deposit is formed that will be transported from the substrate along with the underlying liquified layer. The liquid (and solid deposit), containing the metal ions, can then be subsequently collected in a receptacle and removed from the chamber.

As implied above, depending on the throughput of the multi-species plasma, $\Gamma$, the substrate will be liquified and may possibly include solid deposits. Mathematically, the throughput, $\Gamma$, will include a diffusion term (liquified surface layer) and a deposition term (solid deposition layer), that can be expressed as $$\Gamma = nD/d + ndw/dt$$

where "n" is the solid density, "D" is the diffusion coefficient of metal atoms in the substrate glass, "d" is the thickness of a liquified surface area of the crystalline compound, and "w" is the thickness of a solid deposit on the liquified surface.

For purposes of the present invention, it is envisioned that both the light ions $M_1$ and the heavy ions $M_2$ will have a substantially same diffusion term $(nD/d)$, and a substantially same diffusion rate, with respect to the crystalline compound substrates of the collectors. It is also envisioned, however, that their deposition terms $(ndw/dt)_1$ and $(ndw/dt)_2$, and their respective deposition rates onto the collectors will differ significantly. This is so because, in general, it is expected that the throughput of the heavy ions $M_2$ will be only approximately 5% of the total throughput, $\Gamma$. Further, in the case of the light ions $M_1$, they will most likely have a deposition term $(ndw/dt)_1$ that exceeds the diffusion term $(nD/d)$. Consequently, a solid deposit from the light ions $M_1$ will form on its respective collector. On the other hand, the heavy ions $M_2$ will most likely have a deposition term $(ndw/dt)_2$ that is substantially small and, thus, no cognizable solid deposit from the ions $M_2$ will be formed. In both cases, however, the resultant liquified layer and the possible solid deposit that may form on the collectors will drip from the collectors and be removed from the chamber.

An important factor in the operation of the present invention described above involves heat control. Specifically, the diffusion constant "D" and the viscosity of the liquified substrate layer on the collectors are functions of temperature. Thus, the ability to maintain substrate surface temperatures within a particular range is crucial. For the present invention, this is accomplished by controlling the plasma throughput, $\Gamma$, and selectively moving the substrates relative to the plasma column in the chamber to control the radiative cooling of the substrate surfaces. Specifically, when the plasma in the chamber provides a heat input per unit area, P, and the temperature, T, of the substrate surfaces in the chamber generally need to satisfy the expression $$\sigma \epsilon T^4 = P$$

where $\sigma$ is the Stephan Boltzman constant, and $\epsilon$ is emissivity. For example, if the desired glass melt temperature of the silica is 1000° C., the power input to match the radiative cooling is $1.5 \times 10^5$ w/m² ($\epsilon = 1$).

Another aspect of the present invention involves replenishment of the crystalline compound (silica) on the collector plates. Importantly, as envisioned for the present invention, this can be done without compromising the vacuum chamber of the plasma filter. In detail, this is done by first evacuating the plasma from the chamber. Then, once the plasma has been evacuated, a reactant gas is introduced into the chamber. Preferably, this reactant gas includes a mixture of silane and oxygen. Next, the collector plates are heated to cause a chemical vapor deposition (CVD) of the reactant gas onto the substrate on the collector plate. In the case of silane and oxygen, the result is a build-up of the crystalline compound, silica, on the collector plate. After a desired replenishment of the compound (silica) has been achieved, the multi-species plasma can again be introduced into the chamber (container) of the plasma filter and its operation continued.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENT

Figure 1:
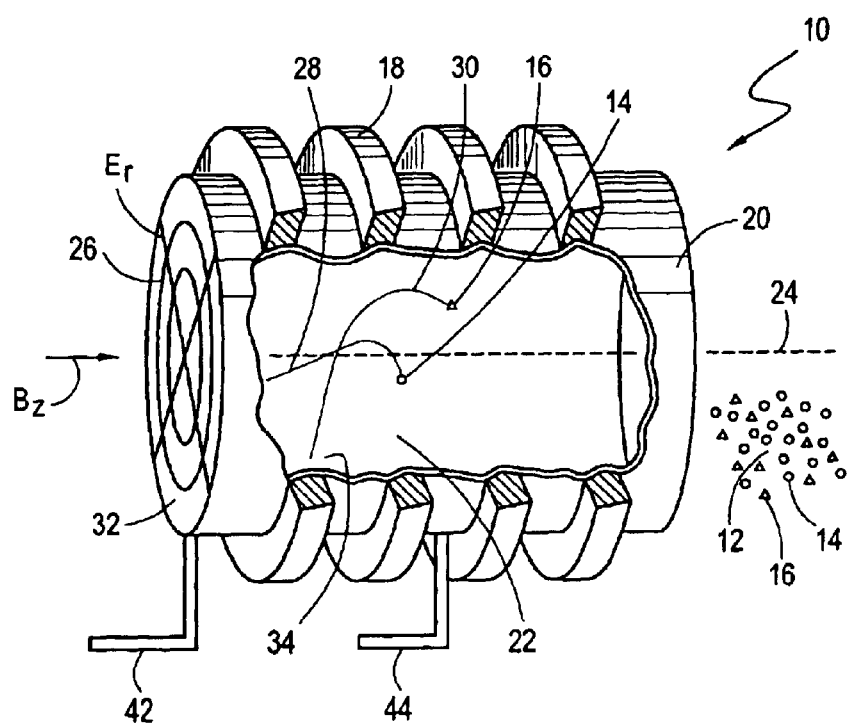
FIG. 1 is a perspective view of a plasma mass filter for use with the present invention with portions broken away for clarity.

Referring initially to FIG. 1, a plasma mass filter for use with the present invention is shown and is generally designated 10. For purposes of the present invention, a plasma mass filter as disclosed and claimed in U.S. Pat. No. 6,096, 220, which issued to Ohkawa on Aug. 1, 2000, for an invention entitled "Plasma Mass Filter" is suitable for use as the filter 10. Accordingly, U.S. Pat. No. 6,096,220 (hereinafter referred to as the '220 patent) is incorporated herein by reference. It is to be appreciated, however, that any apparatus or device that is capable of generating a plasma may be made suitable for use with the present invention.

In a general overview for the operation of the plasma mass filter 10, it is to be appreciated that a useful purpose of the filter 10 is to separate the different metal ions of a multi-species plasma 12 from each other. For purposes of disclosure, these ions of the multi-species plasma 12 will include light ions ($M_1$) 14 of relatively small mass to charge ratios, and heavy ions ($M_2$) 16 of relatively large mass to charge ratios. To accomplish the separation of these ions 12 and 16, the filter 10 includes several magnetic coils 18 that are mounted on the wall 20 of the plasma chamber 22. Specifically, the coils 18 generate a substantially uniform magnetic field $B_z$ that is directed along the axis 24 of the chamber 22. Also, the filter 10 includes an electrode 26 that is mounted on the chamber 22 to generate a radially directed electric field, $E_r$, that is crossed with the magnetic field $B_z$. The resultant crossed electric and magnetic fields (E×B) then separate the ions ($M_1$) 14 from the ions ($M_2$) 16 as disclosed in the '220 patent.

As disclosed in the '220 patent, the plasma mass filter 10 is effective for separating the ions ($M_1$) 14 from the ions ($M_2$) 16 because the ions 14, 16 react differently to the crossed electric and magnetic fields (E×B) in the chamber 22. Specifically, as taught and disclosed in the '220 patent, the light ions ($M_1$) 14 will be confined by the crossed electric and magnetic fields (E×B) for transit through the chamber 22 along the axis 24 and generally on a trajectory 28 (See FIG. 2). On the other hand, the heavy ions ($M_2$) 16 will be ejected into the wall 20 (34) of the chamber 22 on a trajectory 30 (See FIG. 2). Consequently, by positioning a collector 32 at the end of the chamber 22, as shown in FIG. 1, the collector 32 is positioned to capture the light ions ($M_1$) 14 after they have transited the chamber 22. Likewise, by positioning a collector 34 on the wall 20 inside the chamber 22, the collector 34 is positioned to capture the heavy ions ($M_2$) 16 as they are ejected into the wall 20. A more detailed appreciation of how the collectors 32 and 34 work in accordance with the present invention will be had by reference to FIG. 2.

Figure 2:
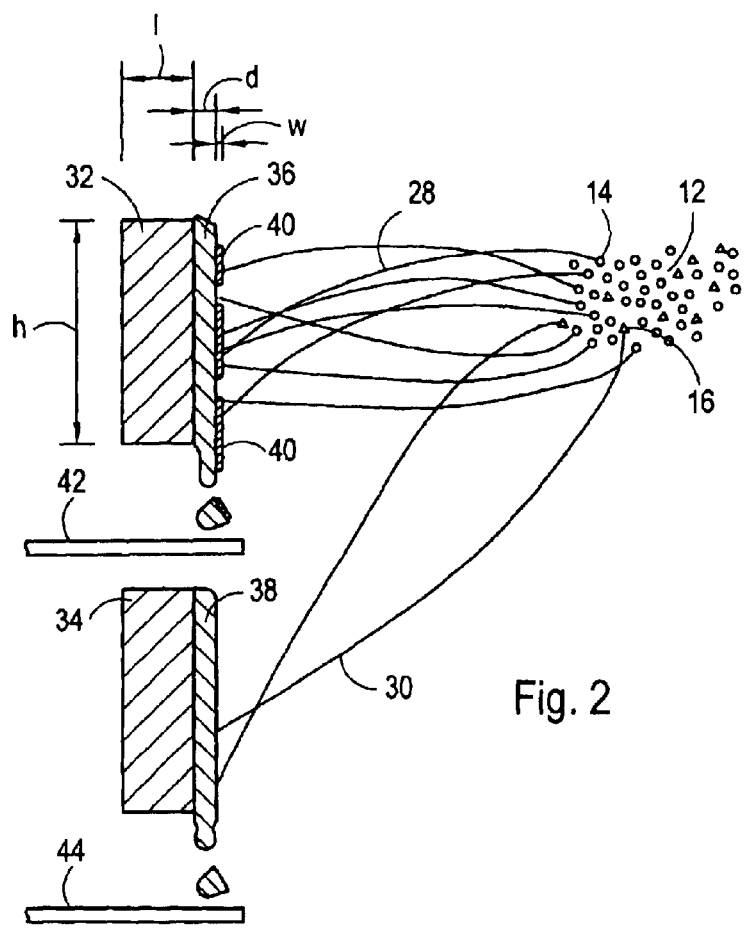
FIG. 2 is a schematic cross sectional view of the collectors of the present invention shown collecting metal ions from a multi-species plasma.

In FIG. 2 a cross-sectional schematic of the collectors 32 and 34 is presented for purposes of discussion. With reference to FIG. 2, it is to be understood that the actual positioning and orientation of the collectors 32 and 34 in the chamber 22 can be varied according to the desires of the operator. Further, it is also to be understood that the collectors 32 and 34 can be moved and repositioned inside the chamber. This can be done by mechanical means known in the art, to alter respective perspective of the collectors 32 and 34 relative to the column of the multi-species plasma 12 as it is introduced into the chamber 22, and as it transits through the chamber 22.

As intended for the present invention, both the collector 32 and the collector 34 comprise a crystalline compound, such as silica ($SiO_2$). Importantly, as is well known to those skilled in the pertinent art, both the light ions ($M_1$) 14 and heavy ions ($M_2$) 16 will diffuse into a crystalline compound, such as silica ($SiO_2$). Accordingly, as the light ions ($M_1$) 14 and the heavy ions ($M_2$) 16 collide with the collectors 32 and 34, they create respective liquified layers 36 and 38 which, under the influence of gravitational forces, will begin to eventually drip from the collectors 32 and 34. Furthermore, for a given throughput per unit area, $\Gamma$, of the multi-species plasma 12 through the chamber 22, a solid deposit layer 40 may, or may not, form on the surface layer 38. Accordingly, the throughput, $\Gamma$, will include a diffusion term (liquified surface layer 34, 38) and a deposition term (solid deposition layer 40), and can be expressed as $$\Gamma = nD/d + n dw/dt$$

where "n" is the solid density, and "D" is the diffusion coefficient of metal atoms in the substrate silica glass of the collectors 32 and 34. As shown in FIG. 2, and as disclosed above, the possibility of the formation of a solid deposit 40 is dependent on whether the deposition rate in the term (ndw/dt) of the throughput, $\Gamma$, exceeds the diffusion rate of the diffusion term (nD/d). In either case, as the liquified layers 36 and 38 on the respective collectors 32 and 34 begin to drip, they will be caught by the respective receptacles 42 and 44 for removal from the chamber 22.

As disclosed above, another important aspect of the present invention involves control of the surface temperatures for the collectors 32 and 34. In accordance with earlier disclosure this temperature control is accomplished by metering the through put, $\Gamma$, of the multi-species plasma 12. Still another important aspect of the present invention involves the replenishment of the crystalline compound (e.g. silica) that is used to trap the separated ions ($M_1$ and $M_2$). In accordance with the present invention, this replenishment can be accomplished without compromising the vacuum of the chamber 22 by sequentially accomplishing several tasks. These include: evacuating the plasma 12 from the chamber 22; introducing a gas reactant (e.g. silane and oxygen) into the chamber 22; and heating the collectors 32 and 34 to cause a chemical vapor deposition (CVD) of the reactant gas onto the collectors 32 and 34.

While the particular Liquid Substrate Collector as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. An apparatus for removing selected metal ions from a plasma which comprises:

a container formed with a chamber for holding said plasma therein;

a substrate mounted in said chamber and exposed for contact with said selected metal ions, wherein said substrate is made of a crystalline compound and wherein said crystalline compound is interactive with said selected metal ions for diffusion of said metal ions into said substrate to create a liquid therewith; and a receptacle for receiving said liquid as said liquid flows from said substrate.

2. An apparatus as recited in claim 1 wherein said crystalline compound is silica ($SiO_2$).

3. An apparatus as recited in claim 2 wherein said substrate in said chamber has a temperature and said substrate further comprises means for moving said substrate to selectively orient said substrate in said chamber to control said temperature thereof.

4. An apparatus as recited in claim 2 further comprising:

a means for evacuating said plasma from said chamber;

a means for introducing silane and oxygen into said chamber; and a means for heating said substrate to cause a chemical vapor deposition (CVD) of silane and oxygen as silica on said substrate to augment said substrate after said plasma has been evacuated from said chamber.

5. An apparatus as recited in claim 2 wherein said substrate has a surface exposed to said plasma and said liquid is a liquified layer of said exposed surface.

6. An apparatus as recited in claim 2 wherein said plasma is a multi-species plasma having relatively light ions with a charge to mass ratio $M_1$, and relatively heavy ions with a charge to mass ratio $M_2$, and wherein said container is a plasma filter for directing ions $M_1$ and ions $M_2$ on separate trajectories in said container, and further wherein said apparatus further comprises:
  a first said substrate for collecting said ions $M_1$; and
  a second said substrate for collecting said ions $M_2$.

7. An apparatus as recited in claim 6 wherein said ions $M_1$ and said ions $M_2$ have a substantially same diffusion rate into respective said first and second substrates, and wherein said ions $M_1$ have a first deposition rate onto said first substrate and said ions $M_2$ have a second deposition rate onto said second substrate, and further wherein said first deposition rate is greater than said second deposition rate.

8. An apparatus as recited in claim 7 wherein said first deposition rate is greater than said diffusion rate and said second deposition rate is less than said diffusion rate.

9. An apparatus for removing metal ions from a plasma chamber which comprises:
  an injector for introducing a plasma containing said metal ions into said chamber, wherein said plasma has a predetermined throughput, $\Gamma$;
  a collector plate mounted in said chamber for holding a crystalline compound substrate thereon, wherein said crystalline compound is exposed in said chamber to interact with said plasma in accordance with the expression $$\Gamma = nD/d + ndw/dt$$

where "n" is the solid density, "D" is the diffusion coefficient of metal atoms in the substrate glass, "d" is the thickness of a liquified surface area of said crystalline compound, and "w" is the thickness of a solid deposit on said liquified surface; and
  a receptacle for receiving a liquid as said liquid flows from said substrate.

10. An apparatus as recited in claim 9 further comprising:
  a means for evacuating said plasma from said chamber;
  a means for introducing a reactant gas into said chamber; and
  a means for heating said collector plate to cause a chemical vapor deposition (CVD) of said crystalline compound from said reactant gas onto said substrate to augment said crystalline compound substrate after said plasma has been evacuated from said chamber.

11. An apparatus as recited in claim 10 wherein said reactant gas includes silane and oxygen, and said crystalline compound is silica.

12. An apparatus as recited in claim 10 wherein said reactant gas is silicone alkoxide.

13. An apparatus as recited in claim 9 wherein said plasma is a multi-species plasma having relatively light ions with a charge to mass ratio $M_1$, and relatively heavy ions with a charge to mass ratio $M_2$, and wherein said plasma chamber is a plasma filter for directing ions $M_1$ and ions $M_2$ onto separate trajectories therein, and wherein said apparatus further comprises:
  a first said substrate for collecting said ions $M_1$; and
  a second said substrate for collecting said ions $M_2$.

14. An apparatus as recited in claim 13 wherein said ions $M_1$ and said ions $M_2$ have a substantially same diffusion term (nD/d) with respect to said first and second substrates, and wherein said ions $M_1$ have a first deposition term $(ndw/dt)_1$ onto said first substrate to create a solid deposit from said ions $M_1$ thereon, and said ions $M_2$ have a second deposition term $(ndw/dt)_2$ onto said second substrate, wherein said second deposition term is substantially equal to zero to preclude a solid deposit from said ions $M_2$ thereon.

15. An apparatus as recited in claim 9 wherein said plasma provides a heat input per unit area, P, and said substrate in said chamber has a temperature, T, and said substrate further comprises means for moving said substrate to selectively orient said substrate in said chamber to control said temperature thereof to satisfy the expression $$\sigma \epsilon T^4 = P$$

where $\sigma$ is the Stephan Boltzman constant, and $\epsilon$ is emissivity.

16. A method for removing metal ions from a plasma chamber which comprises the steps of:
  introducing a plasma containing said metal ions into said chamber, wherein said plasma has a predetermined throughput, $\Gamma$;
  mounting a collector plate in said chamber for holding a crystalline compound substrate thereon, wherein said crystalline compound is exposed in said chamber to interact with said plasma in accordance with the expression $$\Gamma = nD/d + ndw/dt$$

where "n" is the solid density, "D" is the diffusion coefficient of metal atoms in the substrate glass, "d" is the thickness of a liquified surface area of said crystalline compound, and "w" is the thickness of a solid deposit on said liquified surface; and
  providing a receptacle for receiving a liquid as said liquid flows from said substrate.

17. A method as recited in claim 16 wherein said plasma provides a heat input per unit area, P, and said substrate in said chamber has a temperature, T, and wherein said method further comprises the step of moving said substrate to selectively orient said substrate in said chamber to control said temperature thereof to satisfy the expression $$\sigma \epsilon T^4 = P$$

where $\sigma$ is the Stephan Boltzman constant, and $\epsilon$ is emissivity.

18. A method as recited in claim 16 further comprising the steps of:
  a means for evacuating said plasma from said chamber;
  evacuating said plasma from said chamber;
  introducing a reactant gas into said chamber; and
  heating said substrate to cause a chemical vapor deposition (CVD) of said reactant gas on said substrate as said crystalline compound to augment said substrate while said plasma is evacuated from said chamber.

19. A method as recited in claim 18 wherein said reactant gas includes silane and oxygen, and said crystalline compound is silica.

20. A method as recited in claim 19 wherein said plasma is a multi-species plasma having relatively light ions with a charge to mass ratio $M_1$, and relatively heavy ions with a charge to mass ratio $M_2$, and wherein said plasma chamber is a plasma filter for directing ions $M_1$ and ions $M_2$ onto separate trajectories therein, and wherein said method further comprises the steps of:

collecting said ions $M_1$ on a first said substrate; and collecting said ions $M_2$ on a second said substrate wherein said ions $M_1$ and said ions $M_2$ have a substantially same diffusion term (nD/d) with respective said first and second substrates, and wherein said ions $M_1$ have a first deposition term $(ndw/dt)_1$ onto said first substrate to create a solid deposit from said ions $M_1$ thereon, and said ions $M_2$ have a second deposition term $(ndw/dt)_2$ onto said second substrate, wherein said second deposition term is substantially equal to zero to preclude a solid deposit from said ions $M_2$ thereon.

\* \* \* \* \*